United States Patent
Miyahara et al.

(10) Patent No.: US 10,298,242 B2
(45) Date of Patent: May 21, 2019

(54) PHASE CONTROL OSCILLATOR

(71) Applicant: NIHON DEMPA KOGYO CO., LTD., Tokyo (JP)

(72) Inventors: Ken Miyahara, Saitama (JP); Kazunori Hasegawa, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 15/919,231

(22) Filed: Mar. 13, 2018

(65) Prior Publication Data
US 2018/0269883 A1 Sep. 20, 2018

(30) Foreign Application Priority Data

Mar. 16, 2017 (JP) ................. 2017-050884

(51) Int. Cl.
| | | |
|---|---|---|
| *H03L 7/093* | (2006.01) | |
| *H03L 7/099* | (2006.01) | |
| *H03L 7/107* | (2006.01) | |
| *H03L 7/18* | (2006.01) | |
| *H03L 7/10* | (2006.01) | |
| *H03L 1/00* | (2006.01) | |

(52) U.S. Cl.
CPC ............... *H03L 7/093* (2013.01); *H03L 1/00* (2013.01); *H03L 7/099* (2013.01); *H03L 7/101* (2013.01); *H03L 7/1075* (2013.01); *H03L 7/18* (2013.01)

(58) Field of Classification Search
CPC ......... H03L 7/093; H03L 7/099; H03L 7/143; H03L 7/101; H03L 7/1075; H03L 7/095
See application file for complete search history.

(56) References Cited

U.S. PATENT DOCUMENTS

| | | | | |
|---|---|---|---|---|
| 5,576,664 A | * | 11/1996 | Herold ................... | H03L 7/091 331/1 A |
| 8,885,788 B1 | * | 11/2014 | Rey ........................ | H03L 7/1075 375/376 |
| 9,008,255 B1 | * | 4/2015 | Azenkot ................. | H03L 7/093 375/376 |
| 2016/0226500 A1 | * | 8/2016 | Zhao ....................... | H03G 3/20 |
| 2017/0307762 A1 | * | 10/2017 | Nakajima ............. | G01S 19/235 |

FOREIGN PATENT DOCUMENTS

JP   H0795069   4/1995

* cited by examiner

*Primary Examiner* — Aristocratis Fotakis
(74) *Attorney, Agent, or Firm* — JCIPRNET

(57) ABSTRACT

A phase control oscillator includes a voltage control oscillator, a phase comparator, a loop filter, and a storage unit. The loop filter is configured such that if the phase control oscillator starts operating, the loop filter outputs a control voltage based on phase difference information to the voltage control oscillator. The storage unit stores deviation information indicative of a deviation between a phase difference when the loop filter outputs the control voltage in the case where the phase control oscillator starts operating and the phase difference indicated by the phase difference information. After the loop filter outputs the control voltage in response to the phase control oscillator starting operating, the loop filter outputs the control voltage based on the phase difference information output from the phase comparator and the deviation information stored in the storage unit, to the voltage control oscillator.

4 Claims, 3 Drawing Sheets

PHASE CONTROL OSCILLATOR

CROSS-REFERENCE TO RELATED APPLICATIONS

This application is based on and claims priority under 35 U.S.C. § 119 to Japanese Patent Application No. 2017-050884, filed on Mar. 16, 2017, the entire content of which is incorporated herein by reference.

Technical Field

This disclosure relates to a phase control oscillator.

Description of the Related Art

There has been known a PLL circuit that performs a feedback control on a voltage control oscillator such that a phase difference between a reference signal input from outside and an oscillation signal output from the oscillator becomes constant to stably output the oscillation signal. The PLL circuit has been contrived to shorten a period from an operation start until a lock-up state, which is a state of the constant phase difference. For example, Japanese Unexamined Patent Application Publication No. 7-95069 discloses that a storage unit stores a value of a control voltage output to a voltage control oscillator when a state enters a lock-up state in the past and the control voltage is output to the voltage control oscillator based on the value of the control voltage stored in the storage unit at an operation start.

The use of a crystal resonator for the voltage control oscillator in the PLL circuit generates aging variation where a frequency of the oscillation signals varies as the time passes. In view of this, the PLL circuit performs a learning process that changes control voltages output to the voltage control oscillator as the time passes when the voltage control oscillator outputs the oscillation signal at the identical frequency.

However, when the operation of the PLL circuit is started again after the elapse of long time after the operation of the PLL circuit is stopped, a secular change in the crystal resonator progresses, and the control voltage stored in the storage unit is different from the control voltage required to enter the lock-up state at the time point of resuming the operation. Accordingly, when the operation of the PLL circuit is started again after the elapse of long time after the operation of the PLL circuit is stopped, this causes a problem that a period until the state enters the lock-up state is taken.

A need thus exists for a phase control oscillator which is not susceptible to the drawback mentioned above.

SUMMARY

According to a first aspect of this disclosure, there is provided a phase control oscillator that outputs an oscillation signal at a predetermined frequency. The phase control oscillator includes a voltage control oscillator, a phase comparator, a first storage unit, a loop filter, and a second storage unit. The voltage control oscillator is configured to output the oscillation signal based on a control voltage. The phase comparator is configured to output a phase difference information indicative of a phase difference between a reference signal and the oscillation signal. The first storage unit is configured to store the phase difference information output from the phase comparator. The loop filter is configured such that if the phase control oscillator starts operating, the loop filter outputs the control voltage based on the phase difference information stored in the first storage unit to the voltage control oscillator. The second storage unit is configured to store a deviation information. The deviation information is indicative of a deviation between the phase difference when the loop filter outputs the control voltage in a case where the phase control oscillator starts operating and the phase difference indicated by the phase difference information stored in the first storage unit. After the loop filter outputs the control voltage in response to the phase control oscillator starting operating, the loop filter outputs the control voltage based on the phase difference information output from the phase comparator and the deviation information stored in the second storage unit, to the voltage control oscillator.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

[Configuration of PLL Circuit 1]

Figure 1:
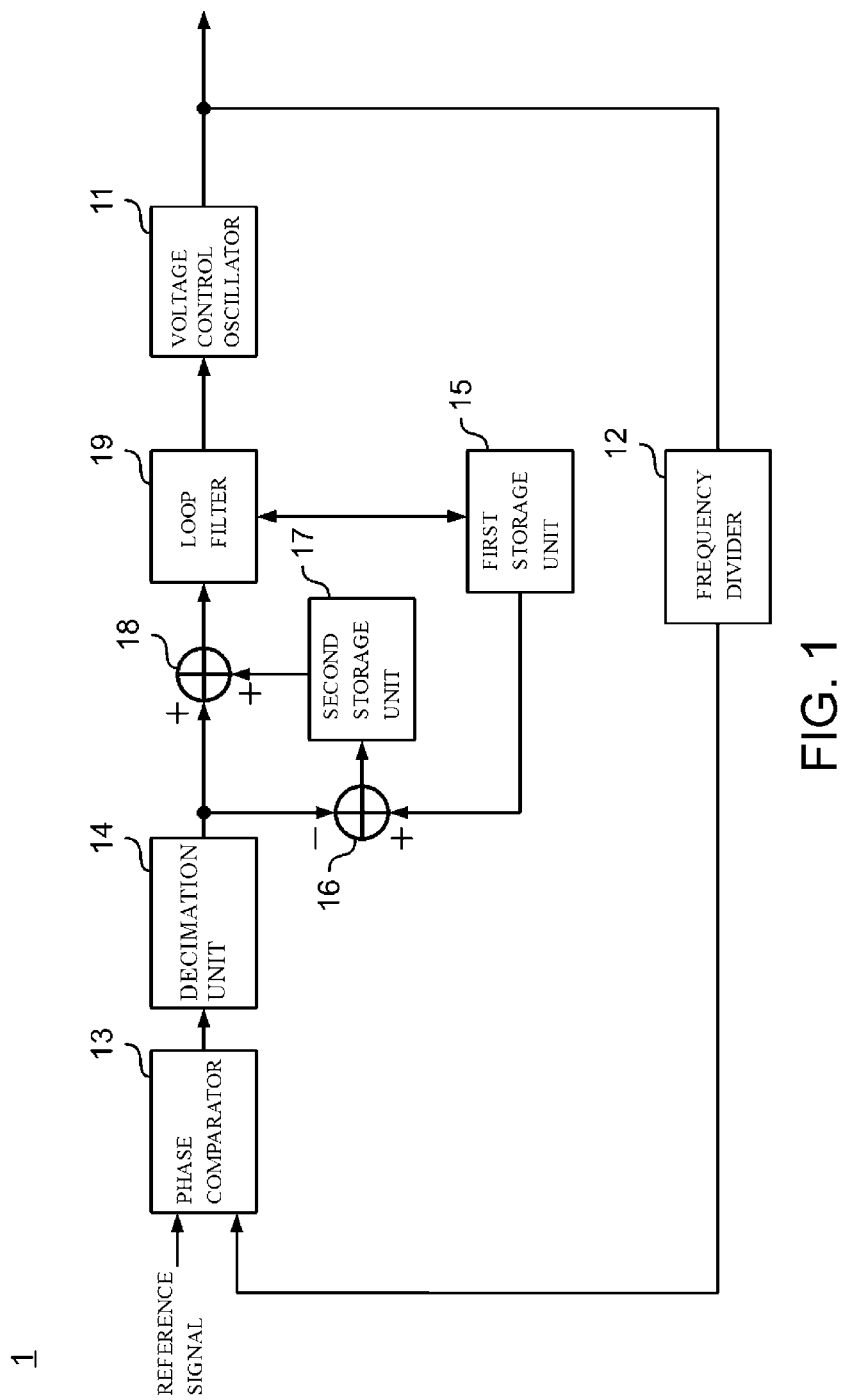
FIG. 1 is a drawing illustrating a configuration of a PLL circuit according to an embodiment.

FIG. 1 is a drawing illustrating the configuration of the PLL circuit 1 as a phase control oscillator according to the embodiment. The PLL circuit 1 generates and outputs an oscillation signal at a predetermined frequency based on a reference signal. The PLL circuit 1 includes a voltage control oscillator 11, a frequency divider 12, a phase comparator 13, a decimation unit 14, a first storage unit 15, a subtractor 16, a second storage unit 17, an adder 18, and a loop filter 19.

The PLL circuit 1 according to the embodiment has a learning function that changes a control voltage output to the voltage control oscillator 11 as the time passes when the voltage control oscillator 11 outputs the oscillation signals at a predetermined frequency. Specifically, the first storage unit 15 in the PLL circuit 1 stores phase difference information indicative of a phase difference between the reference signal and the oscillation signal. When the PLL circuit 1 resumes the operation after stopping the operation, the loop filter 19 outputs the control voltage based on the phase difference information stored in the first storage unit 15 to the voltage control oscillator 11. This allows the PLL circuit 1 to shorten a period from when the operation is resumed after the operation is stopped until the lock-up state in which the phase difference becomes constant.

Here, when a secular change in a crystal resonator constituting the voltage control oscillator 11 progresses, the control voltage output to the voltage control oscillator 11 does not correspond to a control voltage required to enter the lock-up state at the time point of resuming the operation.

In contrast to this, the PLL circuit 1 according to the embodiment causes the second storage unit 17 to store deviation information indicative of a deviation between the phase difference when the loop filter 19 outputs the control voltage when the PLL circuit 1 starts operating and the phase difference indicated by the phase difference information stored in the first storage unit 15. After the loop filter 19 outputs the control voltage in response to the PLL circuit 1 starting operating, the loop filter 19 outputs the control voltage based on the phase difference information output from the phase comparator 13 and the deviation information stored in the second storage unit 17 to the voltage control oscillator 11. Even if the operation stop period is long, this configuration allows the PLL circuit 1 to shorten the period from the operation start until the lock-up state.

The following describes details of respective components constituting the PLL circuit 1.

The voltage control oscillator 11 includes the crystal resonator and generates the oscillation signals at the predetermined frequency determined in advance based on the control voltage output from the loop filter 19. The voltage control oscillator 11 outputs the generated oscillation signals to outside and outputs the oscillation signals to the frequency divider 12.

The frequency divider 12 divides the oscillation signals output from the voltage control oscillator 11 at a predetermined dividing ratio to generate frequency division signals. The frequency divider 12 outputs the generated frequency division signals to the phase comparator 13.

The phase comparator 13, the decimation unit 14, the subtractor 16, and the adder 18 are achieved by a digital circuit. It is assume that, at a front stage of the phase comparator 13, an AD converter (not illustrated), which converts input analog signals into digital signals, is disposed.

The phase comparator 13 generates the phase difference information indicative of the phase difference between the reference signals input from outside and the oscillation signals. The reference signal is a signal output from a crystal controlled oscillator such as a built-in oven controlled crystal oscillator (Oven-Controlled Crystal Oscillator: OCXO). Specifically, the phase comparator 13 generates the phase difference information indicative of the phase difference between the reference signal and the frequency division signal generated by the frequency divider 12. The phase comparator 13 outputs the generated phase difference information to the loop filter 19 via the decimation unit 14 and the adder 18. The phase comparator 13 outputs the generated phase difference information to the subtractor 16 via the decimation unit 14.

The decimation unit 14 thins out the phase difference information output from the phase comparator 13. For example, the decimation unit 14 outputs the phase difference information output from the phase comparator 13 at every predetermined time to thin out the phase difference information output from the phase comparator 13. The decimation unit 14 outputs the phase difference information to the loop filter 19 via the adder 18. The decimation unit 14 outputs the phase difference information to the subtractor 16. By thus including the decimation unit 14, the PLL circuit 1 can reduce a process load applied to the subtractor 16, the adder 18, and the loop filter 19, which are connected to the latter stage of the decimation unit 14.

The first storage unit 15 is, for example, an Electrically Erasable Programmable Read-Only Memory (EEPROM). The first storage unit 15 stores the phase difference information output from the phase comparator 13. The first storage unit 15 stores the phase difference information input to the loop filter 19.

The subtractor 16 calculates a deviation indicative of a difference between the phase difference indicated by the phase difference information output from the phase comparator 13 in response to the output of the control voltage by the loop filter 19 when the PLL circuit 1 starts operating; and the phase difference indicated by the phase difference information stored in the first storage unit 15. The subtractor 16 causes the second storage unit 17 to store the deviation information indicative of the calculated deviation. Specifically, the subtractor 16 subtracts the phase difference indicated by the phase difference information output from the phase comparator 13 from the phase difference indicated by the phase difference information stored in the first storage unit 15 to calculate the deviation.

The second storage unit 17 is, for example, an EEPROM. The second storage unit 17 stores the deviation information.

The adder 18 adds the phase difference indicated by the phase difference information output from the phase comparator 13 to the deviation indicated by the deviation information stored in the second storage unit 17 to output corrected phase difference information to the loop filter 19.

Specifically, when the second storage unit 17 stores the deviation information, the adder 18 generates the corrected phase difference information based on the phase difference information output from the phase comparator 13 and input via the decimation unit 14 and this, deviation information. The adder 18 outputs this connected phase difference information to the loop filter 19. When the second storage unit 17 does not store the deviation information, the adder 18 outputs the phase difference information output from the phase comparator 13 and input via the decimation unit 14 to the loop filter 19.

The loop filter 19 is constituted of a digital circuit and a DA converter. The loop filter 19 is, for example, a low-pass filter. The loop filter 19 generates control information indicative of a value of the control voltage to control the voltage control oscillator 11 based on the phase difference information. The loop filter 19 converts the generated control information into the control voltage and outputs this control voltage to the voltage control oscillator 11. The loop filter 19 causes the first storage unit 15 to store the input phase difference information. Here, when the PLL circuit 1 enters the lock-up state, the loop filter 19 may store the input phase difference information to the first storage unit 15.

The following specifically describes processes by the loop filter 19 in the case where the PLL circuit 1 stops the operation for a long period of time and then resumes the operation. It is assumed that, when the PLL circuit 1 suspends the operation, the first storage unit 15 stores the phase difference information.

When the PLL circuit 1 starts operating, the loop filter 19 generates the control information based on the phase difference information stored in the first storage unit 15. The loop filter 19 converts the control information into the control voltage to output this control voltage to the voltage control oscillator 11.

Here, by stopping the operation by the PLL circuit 1 for a long time, the secular change in the crystal resonator constituting the voltage control oscillator 11 progresses. Accordingly, the control voltage output from the loop filter 19 is different from the control voltage required to enter the lock-up state at the time point of the PLL circuit 1 resuming the operation. This embodiment assumes that the control voltage required to enter the lock-up state at the time point of the PLL circuit 1 resuming the operation becomes higher than the control voltage output from the loop filter 19 based on the phase difference information stored in the first storage unit 15.

The voltage control oscillator 11 generates the oscillation signal based on the input control voltage and outputs this oscillation signal to outside and outputs the oscillation signal to the frequency divider 12. The frequency divider 12 divides the oscillation signals at a predetermined division ratio to generate the frequency division signals and outputs the frequency division signals to the phase comparator 13.

The phase comparator 13 generates the phase difference information indicative of the phase difference between the reference signal input from outside and the frequency division signal generated by the frequency divider 12. Here, because the control voltage output from the loop filter 19 is different from the control voltage required to enter the lock-up state at the time point of the PLL circuit 1 resuming the operation, the phase difference indicated by the phase difference information output from the phase comparator 13 is also different from the phase difference producing the lock-up state.

When the PLL circuit 1 resumes the operation, the subtractor 16 calculates the deviation indicative of the difference between the phase difference indicated by the phase difference information stored in the first storage unit 15 and the phase difference indicated by the phase difference information output from the phase comparator 13 and causes the second storage unit 17 to store the deviation information indicative of this deviation.

The adder 18 adds the deviation indicate by the deviation information stored in the second storage unit 17 to the phase difference indicated by the phase difference information output from the phase comparator 13 to calculate corrected phase difference. The corrected phase difference becomes a phase difference corresponding to the lock-up state at the time point of the PLL circuit 1 resuming the operation. The adder 18 outputs the corrected phase difference information indicative of the corrected phase difference to the loop filter 19.

The loop filter 19 generates the control information indicative of the value of the control voltage based on the corrected phase difference information output from the adder 18. The loop filter 19 converts the generated control information into the control voltage and outputs the control voltage to the voltage control oscillator 11. Since the control voltage is generated based on the corrected phase difference information, the control voltage corresponds to the lock-up state at the time point of the PLL circuit 1 resuming the operation. This allows the voltage control oscillator 11 to output the frequency corresponding to the lock-up state, namely, the oscillation signal at the predetermined frequency.

The loop filter 19 causes the first storage unit 15 to store the corrected phase difference information output from the adder 18. Accordingly, when the second storage unit 17 stores the deviation information, the first storage unit 15 stores the corrected phase difference information indicative of the corrected phase difference found by adding the phase difference indicated by the phase difference information output from the phase comparator 13 to the deviation indicated by the deviation information stored in the second storage unit 17.

[Time Series Change of Control Voltage]

Figure 2:
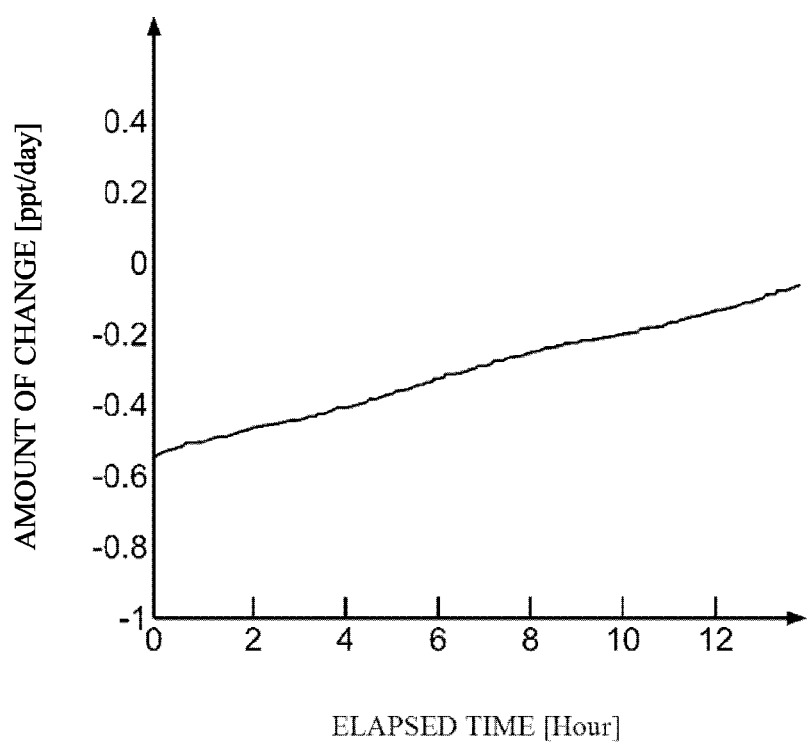
FIG. 2 is a drawing illustrating a time series change in a control voltage output from a loop filter in the PLL circuit according to the embodiment.

Subsequently, the following describes an example of the time series change in the frequency of the oscillation signal output from the PLL circuit 1. FIG. 2 is a drawing illustrating the time series change in the control voltage output from the loop filter 19 in the PLL circuit 1 according to the embodiment.

The graph illustrated in FIG. 2 has an elapsed time on the horizontal axis and an amount of change in the control voltage in one day on the vertical axis. It can be confirmed from FIG. 2 that the amount of change in one day is about 0.6 parts-per-trillion (ppt) or less. That is, it can be also confirmed that with the PLL circuit 1, the control voltage hardly changes as the time passes; therefore, the voltage control oscillator 11 can output the oscillation signals at the predetermined frequency.

Figure 3:
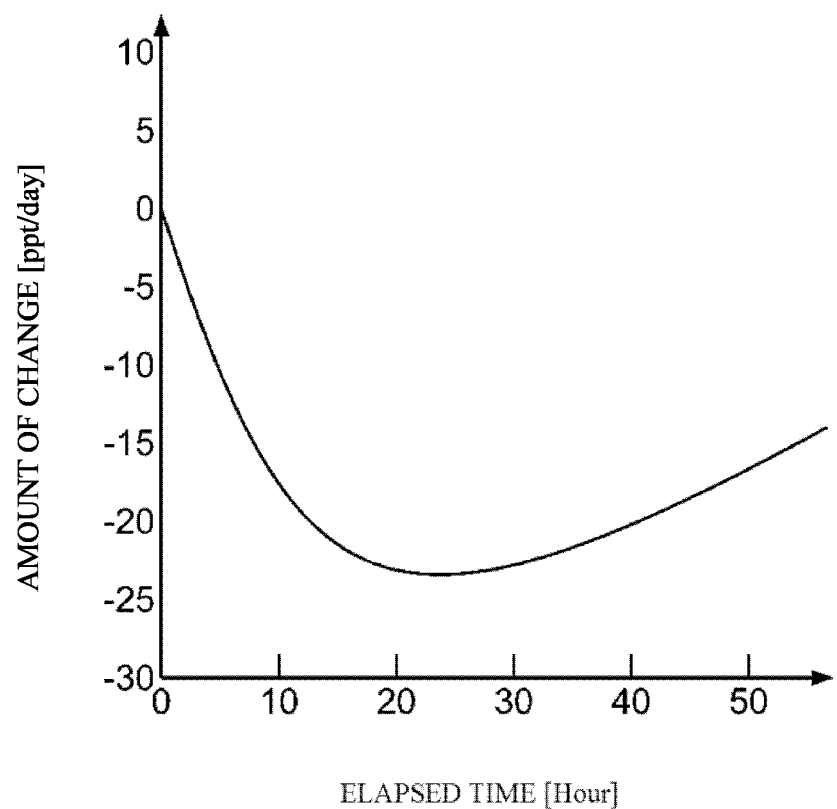
FIG. 3 is a drawing illustrating a time series change of a control voltage output from a loop filter in a conventional PLL circuit.

FIG. 3 is a drawing illustrating a time series change of a control voltage output from a loop filter in a conventional PLL circuit. Here, it is assumed that the conventional PLL circuit does not include the subtractor 16, the second storage unit 17, and the adder 18 in the PLL circuit 1 and has the configuration identical to the other configuration of the PLL circuit 1.

When the conventional PLL circuit resumes the operation after the long-time stop, since the control voltage output from the loop filter is different from the control voltage required to enter the lock-up state at the time point of this PLL circuit resuming the operation, transient response characteristics appear in association with the difference in these control voltages. It can be confirmed from FIG. 3 that the amount of change in the control voltage in one day increases as the time elapses, and the amount of change becomes about 23 ppt after the elapse of 25 hours from when the PLL circuit resumes the operation. That is, it can be confirmed that the control voltage changes as the time and the period until the conventional PLL circuit enters the lock-up state takes longer than the PLL circuit 1.

Effects of Embodiment

As described above, the PLL circuit 1 according to the embodiment includes the second storage unit 17, which stores the deviation information indicative of the deviation between the phase difference when the loop filter 19 outputs the control voltage in the case where the PLL circuit 1 itself stops operating and then resumes the operation; and the phase difference indicated by the phase difference information stored in the first storage unit 15. After the loop filter 19 in the PLL circuit 1 outputs the control voltage in response to the start of the operation by the PLL circuit 1, the loop filter 19 outputs the control voltage based on the phase difference information output from the phase comparator 13 and the deviation information stored in the second storage unit 17 to the voltage control oscillator 11.

Thus, the PLL circuit 1 can specify the deviation corresponding to the secular change in the voltage control oscillator 11 while the PLL circuit 1 stops the operation and learn the control voltage required to enter the lock-up state at the time point of resuming the operation based on this deviation. Accordingly, even if the operation stop period is long at the operation resumption, the period from the operation start until the lock-up state of the PLL circuit 1 can be shortened.

While in the disclosure has been described above with reference to the embodiments, the technical scope of the disclosure is not limited to the scope of the embodiments described above. It is apparent that a variety of variations and modifications of the above-described embodiments can be made by those skilled in the art. It is apparent from accompanying claims that such variations and modifications may also be encompassed by the technical scope of the disclosure.

The phase control oscillator may be configured as follows. The phase control oscillator further includes an adder configured to add the phase difference indicated by the phase difference information output from the phase comparator to the deviation indicated by the deviation information stored in the second storage unit to find a corrected phase difference. The adder is configured to output a corrected phase difference information indicative of the corrected phase difference to the loop filter. The loop filter is configured to output the control voltage based on the corrected phase difference information to the voltage control oscillator.

The phase control oscillator may be configured as follows. When the second storage unit stores the deviation information, the first storage unit stores corrected phase difference information. The corrected phase difference information is indicative of a corrected phase difference found by adding the phase difference indicated by the phase difference information output from the phase comparator to the deviation indicated by the deviation information stored in the second storage unit.

The phase control oscillator may be configured as follows. The phase control oscillator further includes a decimation unit configured to thin out the phase difference information output from the phase comparator to output the phase difference information to the loop filter.

Even if the operation stop period is long, the embodiment provides an effect of ensuring shortening the period from the operation start until the lock-up state.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A phase control oscillator that outputs an oscillation signal at a predetermined frequency, the phase control oscillator comprising:
    a voltage control oscillator, configured to output the oscillation signal based on a control voltage;
    a phase comparator, configured to output a phase difference information indicative of a phase difference between a reference signal and the oscillation signal;
    a first storage unit, configured to store the phase difference information output from the phase comparator;
    a loop filter, configured such that if the phase control oscillator starts operating, the loop filter outputs the control voltage based on the phase difference information stored in the first storage unit to the voltage control oscillator; and
    a second storage unit, configured to store a deviation information, and the deviation information being indicative of a deviation between the phase difference when the loop filter outputs the control voltage in a case where the phase control oscillator starts operating and the phase difference indicated by the phase difference information stored in the first storage unit, wherein
    after the loop filter outputs the control voltage in response to the phase control oscillator starting operating, the loop filter outputs the control voltage based on the phase difference information output from the phase comparator and the deviation information stored in the second storage unit, to the voltage control oscillator.

2. The phase control oscillator according to claim 1, further comprising:
    an adder, configured to add the phase difference indicated by the phase difference information output from the phase comparator to the deviation indicated by the deviation information stored in the second storage unit to find a corrected phase difference,
    the adder being configured to output a corrected phase difference information indicative of the corrected phase difference to the loop filter,
    wherein the loop filter is configured to output the control voltage based on the corrected phase difference information to the voltage control oscillator.

3. The phase control oscillator according to claim 1, wherein
    when the second storage unit stores the deviation information, the first storage unit stores a corrected phase difference information,
    the corrected phase difference information being indicative of a corrected phase difference found by adding the phase difference indicated by the phase difference information output from the phase comparator to the deviation indicated by the deviation information stored in the second storage unit.

4. The phase control oscillator according to claim 1, further comprising:
    an decimation unit, configured to thin out the phase difference information output from the phase comparator to output the phase difference information to the loop filter.

* * * * *